United States Patent [19]

Zupancic et al.

[11] Patent Number: 4,824,920
[45] Date of Patent: Apr. 25, 1989

[54] VINYL-BENZYL ETHERS OF PHENOL-DICYCLOPENTADIENE ADDUCTS AS NEW THERMOSETTING RESINS FOR COMPOSITES

[75] Inventors: Joseph J. Zupancic, Bensenville; Jeffrey P. Conrad, Chicago; James A. Wrezel, Buffalo Grove; Andrew M. Zweig, Schaumburg, all of Ill.; Jean M. J. Frechet, Ithica, N.Y.

[73] Assignee: Allied-Signal Inc., Morristown, N.J.

[21] Appl. No.: 126,312

[22] Filed: Nov. 30, 1987

Related U.S. Application Data

[63] Continuation-in-part of Ser. No. 941,882, Dec. 15, 1986, abandoned.

[51] Int. Cl.$^4$ ............................................. C08G 61/12
[52] U.S. Cl. .................................... 525/534; 528/205; 522/162; 568/633; 568/634; 525/471
[58] Field of Search ...................... 525/534; 528/205; 522/162

[56] References Cited

U.S. PATENT DOCUMENTS

| | | | |
|---|---|---|---|
| 3,036,138 | 5/1916 | Mingassun et al. | 568/733 |
| 3,305,522 | 2/1967 | Spacht | 568/790 |
| 3,751,375 | 8/1972 | Bender et al. | 568/581 |

Primary Examiner—Harold D. Anderson
Assistant Examiner—Frederick F. Krass
Attorney, Agent, or Firm—Thomas K. McBride; Eugene I. Snyder

[57] ABSTRACT

The resins resulting from converting dicyclopentadiene-phenol adducts to their corresponding vinylbenzyl ethers are an excellent matrix in which to embed fibers to produce a composite. Such resins, especially as a blend of materials with varying molecular weight distribution, are amorphous materials whose glass transition temperature is well under the curing temperature, and whose solubility permits solutions with high solids content so as to afford coatings with high resin content. The extensively crosslinked polymer resulting from thermal, photochemical, or free radical initiated polymerization has excellent thermal and electrical properties for use in multilayer circuit boards.

28 Claims, No Drawings

VINYL-BENZYL ETHERS OF PHENOL-DICYCLOPENTADIENE ADDUCTS AS NEW THERMOSETTING RESINS FOR COMPOSITES

CROSS-REFERENCE TO RELATED APPLICATION

This application is a continuation-in-part of copending application Ser. No. 941,882, now abandoned, filed Dec. 15, 1986, all of which is incorporated by reference.

BACKGROUND OF THE INVENTION

The subject matter of this application is directed toward resins used in the manufacture of reinforced plastics. More particularly, the resins (binders) are used in the preparation of composites formed from fibers embedded in a polymer resin matrix. Even more specifically this application is directed toward the use of such resins in the preparation of circuit board laminates where the reinforcing material is glass or quartz fiber.

To overcome some mechanical and structural limitations of plastics it has become relatively commonplace to reinforce them with other components. Composites formed of various fibers embedded in a polymer resin matrix are especially useful and susceptible to enormous variation depending upon the nature of the fiber used, how the fiber is utilized, and the matrix or binder for the fibers. Materials which have been used as fibers include glass, quartz, oriented polymers such as the aramids (Kevlar TM), graphite and boron. Whatever their composition such fibers can be used as chopped or continuous filaments, and when used as continuous filaments they can all be unidirectional or woven into a fabric. The matrix can be, for example, a polyester, epoxy, polyimide, polyetherketone or polyetherimide resin as either a thermoset or thermoplastic material. The uses for such composites range from airframes to tennis rackets and from boat hulls to rocket motor casings.

A particular area of composite application is that of printed circuit boards, especially multilayer circuit boards, for mounting electronic components. The use of glass fabric as the reinforcing material has become more-or-less standard and epoxy resins are most often used as the matrix. For the fiber to exert a reinforcing action it is necessary that the fibers be completely coated with resin, and to achieve this the glass fiber often is surface treated to provide sites for chemical bonding to the resin or to its precursor or for otherwise improved adhesion to the matrix material.

Multilayer circuit boards are laminates with alternating layers of composite and etched copper sheet. A brief discussion of their manufacture will aid in appreciating the properties requisite for such boards. A woven glass fabric is first impregnated with resin by dipping the cloth in a resin solution, often referred to as the varnish solution, in what is called the A-stage. Solvent is then removed to afford a glass cloth reinforced resin, or prepreg, in what is called the B-stage. In some cases the resin in the prepreg may be partially cured, in other cases uncured, but in all cases the prepreg is a non-tacky, readily handled rigid sheet of glass cloth embedded in and coated with a resin. The finished circuit board is prepared by laminating alternating layers of prepreg and and etched copper foil under conditions of temperature and pressure where resin is cured, i.e., further polymerized and crosslinked to a final infusible, insoluble stage (C-stage).

From the above brief description some necessary and desirable characteristics of the resin may be readily discerned. The circuit board will be subjected to soldering temperatures and may be operated at an elevated temperature, or experience cyclic locally elevated temperatures because of local power generation, and thus the thermal coefficient of expansion of the resin should approximate that of glass to ensure continued dimensional stability and resistance to heat distortion. The resin should have a high solubility in the varnish solution to ensure high resin loading. The varnish solution should have a sufficiently low viscosity for even coating but not too low a viscosity as to run off the fibers. It is necessary that the prepreg not be tacky so that it can be readily handled and stored. The resin is desirably non-crystalline for enhanced solubility in the varnish solution and for good film forming properties in the prepreg. The resin should have adequate flow at the C-stage so as to make void-free laminated bonds, with the curing temperature somewhat higher than the glass transition temperature ($T_g$) of the resin to afford a wider processing "window." The resin also should be chemically resistant to a corrosive environment and to water vapor. To ensure that the discrete electrical components on a circuit board interact only via the etched path on the copper foil, it is desirable that the matrix have a low dielectric constant and high resistance.

The invention to be described is an amorphous, thermosetting resin which affords a varnish solution of high solids content with a viscosity leading to even coating without runoff, which affords a non-tacky prepreg, has a glass transition temperature sufficiently below the curing temperature of afford an adequate window of processing, and which shows excellent flow properties at the C-stage. The final cured resin exhibits a low dielectric constant and dissipation factor, a low coefficient of thermal expansion, and a high glass transition temperature. In short, we believe our cured resin has properties superior to those currently recognized as industry standards in the lamination of circuit boards, and thus presents outstanding benefits.

It needs to be emphasized that although this application will stress the utilization of the resins of our invention in the production of multilayer circuit boards, the resins may be useful in fabricating composites generally. Consequently, it needs to be explicitly recognized that the resins of our invention are intended for composite manufacture without any limitations other than those imposed by the product specifications themselves.

SUMMARY OF THE INVENTION

The purpose of our invention is to provide thermosetting resins whose properties make them desirable in the preparation of composites, especially in laminated multilayer boards of a glass fiber in a polymer matrix. An embodiment comprises ethers of the adduct of a terytbutylcresol and a dicyclopentadiene. In a specific embodiment the ether is a vinylbenzyl ether. In a more specific embodiment the ether is a mixture of vinylbenzyl and alkyl ethers in a ratio of at least 1:1. In a still more specific embodiment at least 80% of the phenolic groups of the tert-butylcresol-dicyclopentadiene adduct have been converted to the ether. In a yet more specific embodiment the ether is paravinylbenzyl ether. Other embodiments will be apparent from the following description.

DESCRIPTION OF THE INVENTION

Our invention is a class of thermosetting resins of a vinylbenzyl ether of a reaction product of a dicyclopentadiene with a phenol. Such reaction products, which are adducts or oligomers of a dicyclopentadiene and a phenol, are described in U.S. Pat. Nos. 3,305,522 and 3,751,375; compare 3,036,138. Such products result from the reaction of a dicyclopentadiene with at least one molar proportion of a phenolic compound in the presence of a Friedel-Craft type catalyst, and in particular the more potent Friedel-Craft catalysts such as aluminum chloride, zinc chloride, ferrous and ferric chloride and boron trifluoride, as well as complexes based on boron trifluoride. The reaction is conducted at a temperature from 25° to 160° C., preferably between 80° and 150° C. The molar ratio of phenolic compound to dicyclopentadiene employed in the reaction mixture can be varied from 1:1 to at least 5:1 with higher ratios possible but without any beneficial effects. The proportions usually employed range from about 1 to about 4 molar proportions of phenolic compounds per mole of dicyclopentadiene. Over most of this range the proportions of reactants provide for a substantial excess of the phenolic compounds beyond that which will actually react with the dicyclopentadiene. The molar proportions of phenolic compounds which react with dicyclopentadiene usually varies from 1 to 2, with the preferred molar proportion of phenol ranging from 1.5 to 1.75. In some instances it may be desirable to carry out the reaction in an inert organic solvent such as benzene, toluene, etc.

The resins of our invention have essentially the formula,

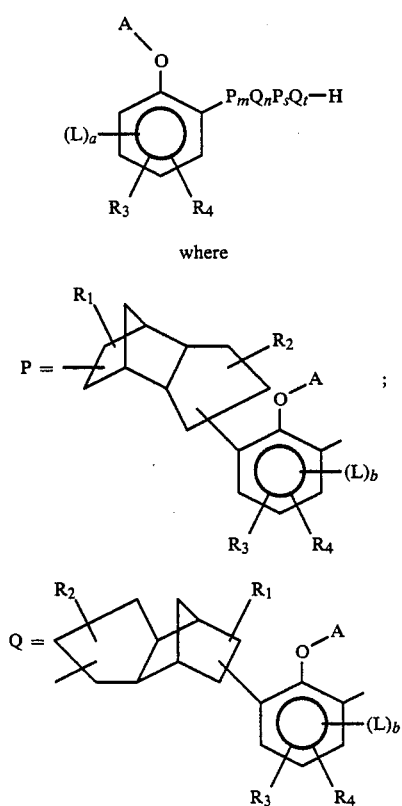

with $R_1$, $R_2$ = H or alkyl of 1–10 carbon atoms;
$R_3$ = H or alkyl of 1–20 carbon atoms;
$R_4$ = H or tert-butyl;
A = H,

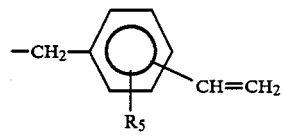

an alkyl moiety containing 1 to 10 carbon atoms, a cycloalkyl moiety having 5 to 10 carbon atoms, or benzyl;
L = Br or Cl;
a = 0, 1, or 2;
b = 0 or 1;
m, n, s, and t are 0 or an integer, and $m+n+s+t=z$ is an integer from 1–10; and
$R_5$ = H, an alkyl moiety of 1–10 carbon atoms, a halogen or alkoxy moiety, or a monovalent aromatic radical.

The dicyclopentadiene portion can be substituted in either ring. $R_1$ and $R_2$ usually are hydrogen, that is, an unsubstituted dicyclopentadiene is preferred in the practice of this invention, but each of $R_1$ and $R_2$ can be an alkyl group, preferably a primary alkyl group, containing up to about 10 carbon atoms. The lower alkyl groups, such as methyl ethyl, propyl, and butyl, are especially preferred where the dicyclopentadiene is substituted. Substitution can be at any position of the dicyclopentadiene ring system but it is preferred that $R_1$ be at a carbon of the 5-member ring not bonded to the aryl group, and that $R_2$ is at the bridge or bridgehead carbon of the bicyclic ring portion.

The phenolic termini of our resins as well as the phenolic portion of P or Q may be saturated hydrocarbon group, a halogen atom, or an alkoxy group. For the condensation with dicyclopentadiene mixtures of such phenols also may be used. Thus, $R_3$ may be an alkyl group containing 1 to about 20 carbon atoms, and those containing up to 10 carbon atoms are preferred in the practice of this invention. Alkyl groups may be primary, secondary, or tertiary. Examples of alkyl groups which may be used in the practice of this invention include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl, with the methyl, ethyl, propyl, and butyl groups, particularly the methyl moiety, being favored. The moiety $R_3$ also may be an aryl group, including substituted aryl groups, especially where the substituent is lower alkyl group containing up to about 4 carbon atoms. As previously mentioned, the moiety $R_3$ also may be a halogen atom or an alkoxy group. The phenol also may be unsubstituted, i.e., $R_3$ = H. Where a substituent is present it is at a position meta or para to the position bearing the oxygen atom. In fact, a mixture of meta- and para-substituted phenols are preferred in the practice of this invention because such a mixture tends to afford an amorphous resin, which is a beneficial feature.

The phenolic termini of our resins and the phenolic portion of P or Q also may be substituted by a group, $R_4$, which is hydrogen or a tertiary butyl moiety. In a preferred embodiment of this invention $R_3$ is a lower alkyl group containing up to 4 carbon atoms and from 5 to 100 percent of all $R_4$ are tert-butyl, and it is even more desirable that from 6 to about 25 percent be tert-butyl. In a yet more preferred embodiment, from 5 to 100 percent of all $R_4$ are tert-butyl and $R_3$ is a methyl group, with the variant where 6 to about 25 percent of $R_4$ are tert-butyl being especially preferred, i.e., $R_4$ is H or a tert-butyl group. The methyl group, $CH_3$, is at a position meta or para to the position bearing the oxygen atom. In fact, a mixture of meta- and para-cresols are preferred in the practice of this invention because such a mixture tends to afford an amorphous resin, which is a beneficial feature.

The basic resins also can be readily modified to be flame retardant by incorporating halogen atoms into the aromatic rings. Thus, L may be a halogen atom, especially bromine, and where the aromatic ring is halogenated a is 0, 1 or 2 and b is 0 or 1. Polyhalogenated materials are desired as flame retardants, which means that a and b are recommended to be maximized. Where the aromatic rings are not halogen substituted then both a and b are 0.

The fragments P and Q are subunits of the adduct. Where the adduct is an oligomer it may be a head-to-head, head-to-tail, or completely or partially random arrangement. Where oligomers are formed they are of relatively low molecular weight. The variables m, n, s, and t each are integers such that z, where z equals $m+n+s+t$, is an integer from 1 to 10, and usually is up to about 5, with z being 1 or 2 preferred in the practice of our invention. The arrangement of the polymeric subunits may be exemplified by the following. Where all the subunits are the same, $n=s=t=0$. Where the subunits alternate, the two simplest cases are $m=n=1$ and $s=t=0$, or $n=s=1$ and $m=t=0$.

The phenolic hydroxyls in the adduct are capped so as to be converted to ethers. At least 80% of the phenolic groups are so capped, and it is desirable that at least 90%, and even more desirable that at least 95%, of the phenolic groups be capped. Stated differently, in the formula above less than about 20% of the A moieties are hydrogen, and desirably less than 10%, even more desirably less than 5%, are hydrogen.

The best case results where the ether portion, A is a vinylbenzyl moiety, that is, of the structure

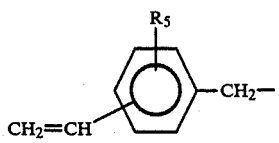

where the vinyl group is either meta or para to the $CH_2$, where $R_5$ is hydrogen, and which usually is a mixture of the meta- and para-isomers. $R_5$ is a chemically inert substituent selected from the group consisting of hydrogen, alkyl moieties containing from 1 to about 10 carbon atoms, the halogens, alkoxy moieties containing from 1 to about 10 carbon atoms, and monovalent radicals whose parent is an aromatic hydrocarbon. As previously indicated usually $R_4$ is hydrogen.

However desirable it may be to have all the phenolic hydroxyls end-capped with vinylbenzyl moieties, there is a decided cost advantage when fewer than all of the other groups are vinylbenzyl, usually at the expense of a somewhat lower dielectric constant. In our invention it is required that at least 50% of the A moieties different from hydrogen be a vinylbenzyl moiety, but a product with better performance characteristics results when from 70 to 100% of the ether groups are vinylbenzyl, and the best product results when 95 to 100% of such groups are vinylbenzyl.

In those cases where less than all of the ether groups are vinylbenzyl, then we are partial to resins where A is an alkyl group containing from 1 to 10 carbons, a cycloalkyl group having 5 to 10 carbons, or a benzyl group. Where A is an alkyl group, the primary alkyl groups are given priority, especially the primary lower alkyl groups containing from 1 to 4 carbon atoms. Thus, the most desirable alkyl groups consist of methyl, ethyl, 1-propyl, 1-butyl, and 2-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl, 2,3-dimethyl-1-butyl, 3,3-dimethyl-1-butyl, 2-methyl-1-pentyl, and so forth. However, it is to be emphased that a benzyl group also operates quite satisfactorily in the practice of our invention. The most common cycloalkyl groups used in our invention are 5- and 6-membered cycloalkanes, unsubstituted or alkyl substituted so as to contain 5 to 10 carbon atoms. Examples are cyclopentyl, cyclohexyl, methylcyclopentyl, dimethylcyclopentyl, ethylcyclopentyl, propylcyclopentyl, butylcyclopentyl, pentylcyclopentyl, ethylmethylcyclopentyl, methylpropylcyclopentyl, butylmethylcyclopentyl, methylcyclohexyl, dimethylcyclohexyl, ethylcyclohexyl, propylcyclohexyl, butylcyclohexyl, and so forth. The 1-propyl group is an especially desirable alternative to the vinylbenzyl moiety, and resins where less than 5% of the A groups are hydrogen with the remainder being vinylbenzyl or 1-propyl in a ratio from 1.1:1 to about 6:1 are highly recommended.

A mixture of thermosetting resins with the foregoing formulae frequently is used in the preparation of composites. The use of a mixture tends to promote formation of an amorphous resin which is desirable both in increasing the solubility of the resin in a varnish solution, in promoting good film-forming qualities, and in providing a stable, non-flaking coating in the prepreg stage. A desirable mixture of resins is one which consists of from about 15 to about 40% by weight of a resin where $z=1$, about 10 to about 30% with $z=2$, about 5 to about 20% with $z=3$, about 5 to about 20% with $z=4$, and about 5 to about 20% with $z=5-10$.

The appended vinyl groups are readily crosslinked in a curing step effected by thermal, chemical, or radiative means. Thermal curing is generally done in the temperature range between about 110° and about 250° C., and in practice multilayer boards may be laminated at a temperature between about 150° and about 200° C. for 0.5–5 hours with post curing at about 180°–250° C. for about 0.5–24 hours. Curing also may be brought about using a free radical initiator, such as azo-bis-isobutyronitrile, benzoyl peroxide, di-t-butyl peroxide, etc. Curing may be effected as well by irradiation, especially by visible and ultraviolet light in the presence of a suitable photoinitiator. Whether thermal, chemical, or photochemical curing is performed, the resin becomes extensively crosslinked and sets to an infusible, insoluble glassy solid.

The resins of this invention may be prepared by an convenient method known in the art. However, they are most readily prepared by reacting a vinylbenzyl halide with the dicyclopentadiene-phenol adduct in a basic solution. Generally a mixture of the meta- and para-isomers of vinylbenzyl chloride are used, although the bromide and, to a lesser extent, the iodide also may be used. The reaction may be conveniently performed in an alcoholic potassium hydroxide solution, often containing acetone, N-methylpyrrolidone, or some other organic cosolvent, at the reflux temperature. Where some of A are alkyl, cycloalkyl, or benzyl moieties these may be prepared by reacting a suitable alkyl, cycloalkyl, or benzyl halide with a partially vinylbenzyl end-capped adduct, or by reacting the uncapped adduct with a mixture of halides.

The materials of our invention also can be blended with other types of vinylbenzyl ethers of functionality greater than or equal to 2 to provide A-stage varnish solutions with tailorable viscosity and variable properties in the cured product such as glass transition temperature, heat distortion temperature, fracture toughness, etc. For example, our resins could be blended with various styrenated bisphenols to raise crosslink density and improve processability of the bis-styryl compound. The materials of our invention are polymers of moderate functionality (i.e., number of vinylbenzyl groups per molecule) and viscosity and they can be incorporated to reduce crystallinity of various styrenated bisphenols where the bisphenols are exemplified by the formula

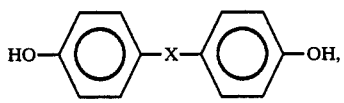

with x being —O—, —C(CH$_3$)$_2$—, —SO$_2$—, —O—, —CO—, and so forth to raise the resin solids content in the A-stage varnish solution, to raise the resin content in the B-stage, and to reduce the amount of resin flow in the C-stage. High-to-moderate molecular weight poly(-vinylbenzyl ethers) also may be useful for improving the shelf life of other styrenated oligomers, and may raise the ductility of the otherwise brittle laminate, such as in the case of styrenated bisphenol A.

The following examples are only illustrative of this invention. Materials used therein are to be construed as only representative of those which can be used in the practice of our invention, and are not a limitation of the invention as claimed.

EXAMPLE I

Preparation of resin. Cresol-dicyclopentadiene adducts resulting from the reaction of different molar proportions of cresol were obtained from Goodyear Rubber Company. The synthesis of the p-vinylbenzyl ether of the adduct resulting from 3 molar proportions of cresol as described below in detail is representative of the synthesis of other ether-capped resins.

To 100 g (0.50 moles phenolic hydroxyls) of a cresol-dicyclopentadiene adduct was added 0.60 moles of vinylbenzyl chloride as a 60/40 mixture of meta/para isomers. Acetone (220 mL) was added and the solution was heated to reflux. To this was added dropwise 76 mL of a 31% methanolic potassium hydroxide solution (0.50 moles KOH) over a period of 1 'hour. The reaction mixture was stirred at ambient temperature for 18 hours, then heated at reflux for an additional two hours. After the mixture was cooled, an additional 200 mL acetone was added and the mixture was stirred overnight. Anhydrous magnesium sulfate was added to desiccate the solution, and after 2 hours solids were removed by filtration. The filtered solution was added to ca. 4 L cold methanol to precipitate the ether and the solid was collected by filtration. Solid was washed with methanol and vacuum dried to give 97.5 g of a beige powdery solid. Some properties of two typical resins are summarized in Table 1.

TABLE 1

| Properties of Adducts and Uncured Resins | | | | |
|---|---|---|---|---|
| Material | $M_n{}^a$ | $M_w{}^b$ | $M_w/M_n$ | $<f>^c$ |
| 3:1 adduct | 515 | 636 | 1.2 | 2.4 |
| Adduct-ether | 854 | 1089 | 1.3 | |
| 3:2 adduct | 793 | 1202 | 1.5 | 3.9 |
| Adduct-ether | 1262 | 1716 | 1.4 | |

$^a$Number-average molecular weight by gel permeation chromatography.
$^b$Weight-average molecular weight by gel permeation chromatography.
$^c$Average number of hydroxyl groups per molecule. Note that $<z> = <f> - 1.0$.

TABLE 2

| | Properties of Uncured Resin | | | |
|---|---|---|---|---|
| Resin Source | $T_m{}^a$ onset, °C. | $T_m{}^b$ peak, °C. | $H_p{}^c$ | $T_p{}^d$, °C. |
| 3:1 adduct | 43 | 48 | 79 | 140 |
| 3:2 adduct | 73 | 83 | 65 | 130 |

$^a$Onset of melting
$^b$Peak melting
$^c$Heat of polymerization in joules per gram.
$^d$Heat of polymerization peak temperature.

EXAMPLE II

Preparation of crosslinked polymer; thermal curing. The resins prepared as described above were thermally cured from a chloroform-toluene solution using a cycle of 100° C. for 16 hours, 120° C. for 2 hours, 160° C. for 18 hours, 200° C. for 3.5 hours, and 225° C. for 1 hour. Some properties of the resulting cured resin are summarized in Table 3.

TABLE 3

| | Properties of Cured Resin | | | | | | |
|---|---|---|---|---|---|---|---|
| | DSC$^a$ | | TMA$^b$ | | | | |
| Resin Origin | $T_g{}^c$ | SP$^d$ | $\bar{\alpha}_g{}^e$ | $\bar{\alpha}_{260}{}^f$ | E$^g$ | $\epsilon'$tan$\delta^h$ | |
| 3:1 adduct | >260 | 186 | 65 | 103 | 2.8 | 0.006 | |
| 3:2 adduct | >260 | 230 | 35 | 55 | 2.8 | 0.006 | |
| 50:50 Blend of 3:1 adduct and styrenated tetrabromo bisphenol A | >290 | — | — | 57 | 2.6 | 0.006 | |

$^a$Differential scanning calorimetry.
$^b$Thermomechanical analysis.
$^c$Glass transition temperature.
$^d$Softening point.
$^e$Thermal expansivity to softening point, ppm/°C.
$^f$Thermal expansivity to 260° C., ppm/°C.
$^g$Dielectric constant measured at 1 MHz, 23° C., 0% relative humidity.
$^h$Dissipation factor measured under above conditions.

EXAMPLE III

Synthesis of styrene-terminated t-Butyl-p-cresol Dicyclopentadiene. To a 5 L three-necked round bottom flask fitted with a mechanical stirring shaft and charged with 2 L of 1-methyl-2-pyrrolidinone, 4.55 g of BHT, and 500.0 g of t-butyl-p-cresol dicyclopentadiene ($M_n$=560, $M_w$=727, dispersity=1.30) was added 236.58 g of vinylbenzyl chloride. A reflux condensor, a pressure equalizing dropping funnel, and a heated water bath were brought into place. The mixture was placed under $N_2$ and brought to 60° C. with stirring. 215 mL of an approximately 9 molal solution of potassium hydroxide in methanol was added dropwise over 30 minutes. The mixture was kept at 60° C. for an additional 3.5 hours. 88.98 g of 1-bromopropane was then added followed by 85 ml of the 9 molal KOH/MeOH which was again added dropwise over 30 minutes. The reaction mixture was kept at 60° C. for an additional 3.5 hours then allowed to cool to room temperature. 2.3 L of toluene were added and the mixture transferred to a separatory funnel and washed with 4×5.7 L of water. The organic phase was dried over $Na_2SO_4$, slurried with Celite and filtered through a glass frit. Solvent was removed by rotary evaporation leaving a brown resin $M_n=657$, $M_w=800$, dispersity 1.29. Samples are identified as follows:
A=Neat resin coating
B=Cast from toluene.

glass frit. Solvent was removed by rotary evaporation leaving a brown resin ($M_n=626$, $M_w=850$, dispersity 1.36).

Samples were cured by heating at 80° C. for 2 hours, 100° C. for 16 hours, 120° C. for 4 hours, 160° C. for 16 hours, 200° C. for 4 hours and then 225° C. for 1 hour. Samples are identified as follows:
A=Neat resin coating without solvent
B=Cast from acetone
C=Neat resin casting without solvent

TABLE 4

| | | | Cured Resin Properties | | | | |
|---|---|---|---|---|---|---|---|
| Sample | Tg(°C.)[a] DSC | Tsp(°C.)[b] TMA | $\bar{a}_g{}^e$ (ppm/°C.) | $\bar{a}_{260}{}^f$ (ppm/°C.) | $\epsilon'/\tan\delta^e$ 0% RH[f] | $\epsilon'/\tan\delta^e$ 50% RH | $H_2O^g$ absorption (wt %) |
| A | >300 | 107 | 41 | 129 | 2.66/.057 | 2.64/.006 | .054 |
| B | >300 | 121 | 58 | 135 | 2.68/.046 | 2.73/.012 | — |

[a]Glass transition temperature.
[b]Softening point.
[c]Coefficient of thermal expansion from 25° C. to Tsp.
[d]Coefficient of thermal expansion from 25° C. to 260° C.
[e]$\epsilon'$ is the dielectric constant, $\tan\delta$ the dissipation factor, measured at 1 MHz, 25° C., two-fluid cell.
[f]Relative humidity.
[g]Weight gain after two weeks at 50% relative humidity.

TABLE 5

D=Cast from toluene

TABLE 6

| | | | Cured Resin Properties | | | | |
|---|---|---|---|---|---|---|---|
| Sample | Tg(°C.)[a] DSC | Tsp(°C.)[b] TMA | $a_g{}^e$ (ppm/°C.) | $a_{260}{}^f$ (ppm/°C.) | $\epsilon'/\tan\delta^e$ 0% RH[f] | $\epsilon'/\tan\delta^e$ 50% RH | $H_2O^g$ absorption (wt %) |
| A | >300 | 132 ± 6 | 69 ± 4 | 122 ± 4 | 2.50/.254 | 2.735/0.027 | 0.075 |
| B | >300 | 125 ± 6 | 77 ± 5 | 123 ± 6 | 2.58/0.010 | 2.68/0.014 | 0.025 |
| C | >300 | 136 ± 2 | 85 ± 2 | 129 ± 4 | 2.59/0.009 | 2.61/0.048 | 0.053 |
| D | >300 | 127 ± 5 | 79 ± 4 | 139 ± 5 | 2.61/0.011 | 2.61/0.042 | 0.050 |

[a]Glass transition temperature.
[b]Softening point.
[c]Coefficient of thermal expansion from 25° C. to Tsp.
[d]Coefficient of thermal expansion from 25° C. to 260° C.
[e]$\epsilon'$ is the dielectric constant, $\tan\delta$ the dissipation factor, measured at 1 MHz, 25° C., two-fluid cell.
[f]Relative humidity.
[g]Weight gain after two weeks at 50% relative humidity.

| Resin Properties | | | |
|---|---|---|---|
| T onset (°C.) | T peak (°C.) | Total H (J/G) | Gel Time @ 170° C. (sec) |
| 161 | 207 | 143 | 1350 |

EXAMPLE IV

Spectroscopic analysis of the product from the previous example indicated the presence of a small amount of residual hydroxyl groups. Material prepared as in that example was alkylated further to completely cap all hydroxyl functionality by the following method. 200.0 g of styrene terminated-alkylated t-butyl p-cresol dicyclopentadiene prepared as in Example III was dissolved in 550 ml of 1-methyl-2-pyrrolidinone and added to a 1 liter 3-neck round bottom flask. The flask was then charged with 26.25 ml of 1-bromopropane and 127 g of BHT. A reflux condensor, a stir bar and a pressure equalizing dropping funnel were brought into place and the flask placed in a 60° C. water bath. 45 ml of an approximately 9 molal solution of KOH in methanol was added dropwise with stirring over 30 minutes. The reaction was maintained at 60° C. for an additional 5.5 hours and then allowed to cool to room temperature. 600 ml of toluene was added and the product washed with 4×1.5 l of water. The organic phase was dried over $Na_2SO_4$, slurried with celite and filtered through a

TABLE 7

| Resin Properties | | | |
|---|---|---|---|
| T onset[a] (°C.) | T peak[b] (°C.) | Total $\Delta H^c$ (J/g) | Gel Time @ 170° C. (sec) |
| 161 | 207 | 143 | 1350 |

[a]Onset of polymerization
[b]Peak polymerization temperature
[c]Total enthalpy of polymerization c. TABLE 8

| | Prepreg Properties[a] | | |
|---|---|---|---|
| T(°C.) | time (min) | Resin Flow | Appearance |
| 150 | 5 | + | good |

[a]108/256 vinylsilane glass

EXAMPLE V

In this example, copolymers of styrene-terminated t-butyl-p-cresol dicyclopentadiene (STBCDP) prepared according to Example III above and styrene-terminated bromo-substituted tetrakisphenolethane (STBTPE) containing 70% vinylbenzyl, 30% propyl groups, were prepared utilizing the curing procedure hereinbefore set forth in the above examples using toluene as the solvent. Analysis of these blends disclosed the following properties which are set forth in Table 9 below.

TABLE 9

| STBCDP wt(g) | STBTPE wt(g) | Tg(°C.)<sup>a</sup> DSC | Tsp(°C.)<sup>b</sup> TMA | $a_g^e$ (ppm/°C.) | $a_{260}^f$ (ppm/°C.) | ε'/tanδ<sup>e</sup> 0% RH | ε'/tanδ<sup>e</sup> 50% RH | H2O<sup>g</sup> absorption (wt %) |
|---|---|---|---|---|---|---|---|---|
| 11.85 | 11.85 | >300 | 107 | 73 | 148 | 2.56/0.014 | 2.79/0.005 | 0.093 |
| 20.54 | 6.84 | >300 | 123 | 62 | 147 | 2.69/0.005 | 2.71/0.006 | 0.082 |

<sup>a</sup>Glass transition temperature.
<sup>b</sup>Softening point.
<sup>c</sup>Coefficient of thermal expansion from 25° C. to Tsp.
<sup>d</sup>Coefficient of thermal expansion from 25° C. to 260° C.
<sup>e</sup>ε' is the dielectric constant, tanδ the dissipation factor, measured at 1 MHz, 25° C., two-fluid cell.
<sup>f</sup>Relative humidity.
<sup>g</sup>Weight gain after two weeks at 50% relative humidity.

EXAMPLE VI

In a similar manner m-cresol dicyclopentadiene ($M_n$=242, $M_w$=488, dispersity 2.02) was reacted first with vinylbenzyl chloride in the presence of KOH followed by 1-bromopropane in the presence of KOH. This material was again found to have small amounts of residual hydroxyl groups. The resin was redissolved and again reacted with 1-bromopropane in the presence of KOH. The product was isolated as described in Examples I and III, $M_n$=292, $M_w$=572 and dispersity 1.96. The resin was cured as described in Example II above.

TABLE 10

| | | Cured Resin Properties | | | | | |
|---|---|---|---|---|---|---|---|
| Sample | Tg(°C.)<sup>a</sup> DSC | Tsp(°C.)<sup>b</sup> TMA | $a_g^e$ (ppm/°C.) | $a_{260}^f$ (ppm/°C.) | ε'/tanδ<sup>e</sup> 0% RH<sup>f</sup> | ε'/tanδ<sup>e</sup> 50% RH | H2O<sup>g</sup> absorption (wt %) |
| 5461-107 | 141 | 123 | 64 | 137 | 2.66/.014 | 2.69/.020 | .05 |

TABLE 11

| | Resin Properties | | |
|---|---|---|---|
| T onset (°C.) | T peak (°C.) | Total H (J/G) | Gel Time @ 170° C. (sec) |
| 143 | 191 | 100 | 77 |

EXAMPLE VII

In this example, copolymers of styrene-terminated t-butyl-p-cresol dicyclopentadiene (STBCDP) prepared according to Example III above and styrene-terminated bromo-substituted tetrakisphenol (STBTPE), containing 70% vinylbenzyl, 30% propyl groups, were prepared utilizing the curing procedure described in the above examples using toluene as the solvent. Analysis of these blends disclosed the following properties.

TABLE 12

| | | | | Properties of STBCDP - STBTPE Copolymers | | | | |
|---|---|---|---|---|---|---|---|---|
| STBCDP wt(g) | STBTPE wt(g) | Tg(°C.)<sup>a</sup> DSC | Tsp(°C.)<sup>b</sup> TMA | $a_g^e$ (ppm/°C.) | $a_{260}^f$ (ppm/°C.) | ε'/tanδ<sup>e</sup> 0% RH | ε'/tanδ<sup>e</sup> 50% RH | H2O<sup>g</sup> absorption (wt %) |
| 9.6483 | 9.7003 | >300 | 150 | 59 | 117 | 2.82/0.0012 | 2.82/0.0003 | 0.106 |
| 14.8427 | 4.8804 | >300 | 143 | 62 | 115 | 2.75/0.0012 | 2.75/0.0008 | 0.097 |

<sup>a</sup>Glass transition temperature.
<sup>b</sup>Softening point.
<sup>c</sup>Coefficient of thermal expansion from 25° C. to Tsp.
<sup>d</sup>Coefficient of thermal expansion from 25° C. to 260° C.
<sup>e</sup>ε' is the dielectric constant, tanδ the dissipation factor, measured at 1 MHz, 25° C., two-fluid cell.
<sup>f</sup>Relative humidity.
<sup>g</sup>Weight gain after two weeks at 50% relative humidity.

What is claimed is:

1. A thermosetting resin comprising a vinylbenzyl ether of the reaction product of a dicyclopentadiene with a phenol, said reaction product having essentially the formula

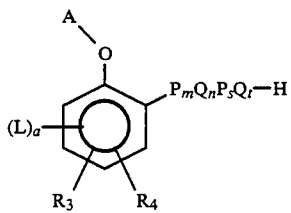

where

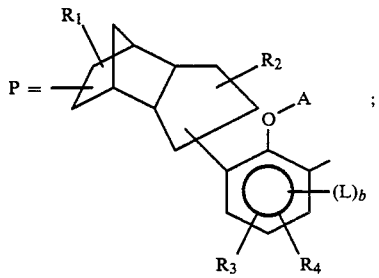

-continued

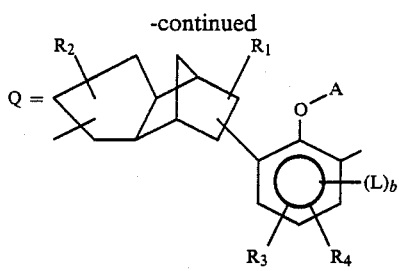

where
R$_1$ and R$_2$ are independently selected from the group consisting of hydrogen or an alkyl moiety containing from 1 to about 10 carbon atoms;
R$_3$ is selected from the group consisting of alkyl moieties containing from 1 to about 20 carbon atoms and is located at a position meta or para to the position of the oxygen on the aromatic ring;
R$_4$ is hydrogen or a tertiary butyl moiety;
m, n, s, and t each are 0 or an integer and whose sum is z, where z is 1–10;
a is 0, 1, or 2;
b is 0 or 1;
L is Cl or Br; and
A is selected from the group consisting of hydrogen, the vinylbenzyl moiety,

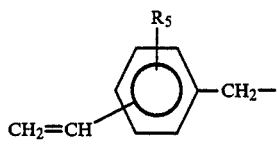

alkyl moieties containing 1 to 10 carbon atoms, cycloalkyl moieties having 5 to 10 carbon atoms, or benzyl, subject to the constraints (a) at least 50% of all A's are the vinylbenzyl moiety, (b) not more than 20% of the A moieties are hydrogen, (c) the vinyl group is para or meta to the benzylic group, and (d) R$_5$ is a chemically inert substituent selected from the group consisting of hydrogen, alkyl moieties containing from 1 to about 10 carbon atoms, the halogens, alkoxy moieties containing from 1 to about 10 carbon atoms, and monovalent radicals whose parent is an aromatic hydrocarbon.

2. The resin of claim 1 where R$_1$ and R$_2$ are hydrogen.
3. The resin of claim 1 where R$_3$ is methyl, ethyl, propyl, or butyl group.
4. The resin of claim 1 where R$_3$ is a methyl group.
5. The resin of claim 1 where z is an integer from 1 to 5.
6. The resin of claim 5 where z is 1 or 2.
7. The resin of claim 1 where A is a m- or p-vinylbenzyl moiety.
8. The resin of claim 1 where R$_1$ and R$_2$ are lower alkyl groups from 1 to about 4 carbon atoms.
9. The resin of claim 1 where L is bromine.
10. The resin of claim 1 where fewer than 5% of A are hydrogen and the remainder are a vinylbenzyl moiety or a linear alkyl moiety having 1 to 4 carbon atoms, and the ratio of the vinylbenzyl to alkyl moieties ranges from 1.1:1 to about 6:1.
11. The resin of claim 3 where at least 5 percent and as many as 100 percent of all R$_4$ is a tertiary butyl moiety.
12. The resin of claim 11 where from about 6 to about 25 percent of all R$_4$ is a tertiary butyl moiety.

13. The resin of claim 1 where R$_3$ is methyl, from about 6 to about 25 percent of all R$_4$ is a tertiary butyl moiety, fewer than 5% of A is hydrogen and the remainder is a vinylbenzyl moiety or linear alkyl moiety having 1 to 4 carbon atoms, and the ratio of vinylbenzyl to alkyl moieties ranges from 1.1:1 to about 6:1.
14. The resin of claim 1 where fewer than 20% of A are hydrogen and the remainder is the vinylbenzyl moiety.
15. A mixture of thermosetting resins comprising vinylbenzyl ethers of the reaction product of a dicyclopentadiene with a phenol, said reaction product having essentially the formula

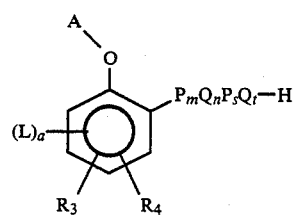

where

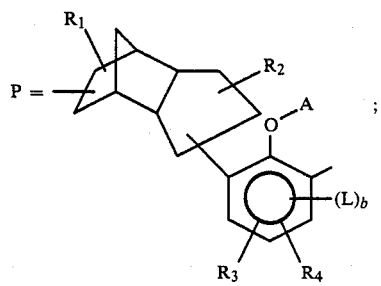

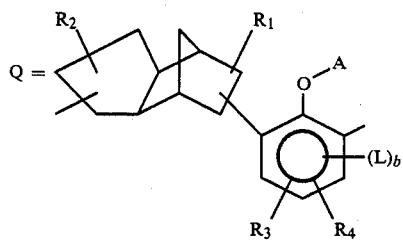

where each of R$_1$ and R$_2$ is hydrogen or an alkyl group containing from 1 to about 10 carbon atoms;
R$_3$ is selected from the group consisting of alkyl moieties containing from 1 to about 20 carbon atoms and is located at a position meta or para to the position of the oxygen on the aromatic ring;
R$_4$ is hydrogen or a tert-butyl moiety and at least 5 percent and as many as 100% are the tert-butyl moieties;
m, n, s, and t each are integers whose sum is z and where z is an integer from 1 to 10;
a is 0, 1, or 2;
b is 0 or 1;
L is Cl or Br; and
A is selected from the group consisting of the vinylbenzyl moiety,

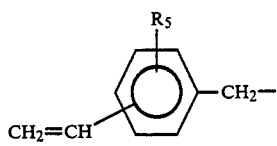

hydrogen, alkyl moieties containing 1 to 10 carbon atoms, cycloalkyl moieties having 5 to 10 carbon atoms, or benzyl subject to the constraints (a) at least 50% of all A's are the vinylbenzyl moiety, (b) not more than 20% of the A moieties are hydrogen, (c) the vinyl group is para or meta to the benzylic group, and (d) $R_5$ is a chemically inert substituent selected from the group consisting of hydrogen, an alkyl or alkoxy moiety containing 1 to about 10 carbon atoms, a halogen, and monovalent radicals whose parent is an aromatic hydrocarbon, in which from about 15 to about 40% of said thermosetting resins have $z=1$, from about 10 to about 30% have $z=2$, from about 5 to about 20% have $z=3$, from about 5 to about 20% have $z=4$, and from about 5 to about 20% have $z=5-10$.

16. The mixture of claim 15 where $R_1$ and $R_2$ are hydrogen.

17. The mixture of claim 15 where $R_1$ and $R_2$ are lower alkyl groups from 1 to about 4 carbon atoms.

18. The mixture of claim 17 where $R_3$ is a methyl group.

19. The mixture of claim 15 where A is a m- or p-vinylbenzyl moiety.

20. The mixture of claim 15 where $R_3$ is a methyl group, from about 6 to about 25 percent of all $R_4$ is a tertiary butyl moiety, fewer than 5% of A are hydrogen and the remainder is a vinylbenzyl moiety or linear alkyl moiety having 1 to 4 carbon atoms, and the ratio of vinylbenzyl to alkyl moieties ranges from 1.1:1 to about 6:1.

21. The mixture of claim 15 where fewer than 5% of A are hydrogen and the remainder is a vinylbenzyl or a primary alkyl moiety having 1 to 4 carbon atoms, and the ratio of the vinylbenzyl to alkyl moieties ranges from 1.1:1 to about 6:1.

22. The polymer resulting from curing the resin of claim 1.

23. The polymer of claim 22 where curing is done thermally.

24. The polymer of claim 22 where curing is performed photochemically.

25. The polymer of claim 22 where the resin has been cured with the aid of a free radical initiator.

26. The copolymer resulting from curing a mixture of the resin of claim 1 with other types of vinylbenzyl ethers of functionality greater than or equal to 2.

27. The polymer resulting from curing the mixture of claim 15.

28. The polymer of claim 27 further characterized in that the mixture contains other types of vinylbenzyl ethers of functionality greater than or equal to 2.

* * * * *